US006858195B2

(12) United States Patent
Aronowitz et al.

(10) Patent No.: US 6,858,195 B2
(45) Date of Patent: Feb. 22, 2005

(54) PROCESS FOR FORMING A LOW DIELECTRIC CONSTANT FLUORINE AND CARBON-CONTAINING SILICON OXIDE DIELECTRIC MATERIAL

(75) Inventors: Sheldon Aronowitz, San Jose, CA (US); Vladimir Zubkov, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 771 days.

(21) Appl. No.: 09/792,685

(22) Filed: Feb. 23, 2001

(65) Prior Publication Data

US 2002/0119315 A1 Aug. 29, 2002

(51) Int. Cl.$^7$ .............................................. C01B 33/12

(52) U.S. Cl. ....................................... 423/337; 423/342

(58) Field of Search ................................. 423/325, 335, 423/337, 342, 345, 346

(56) References Cited

U.S. PATENT DOCUMENTS

| | | | |
|---|---|---|---|
| 3,012,861 A | 12/1961 | Ling ........................ 23/223.5 |
| 3,178,392 A | 4/1965 | Kriner ...................... 260/46.5 |
| 3,652,331 A | 3/1972 | Yamazaki .................. 117/201 |
| 3,832,202 A | 8/1974 | Ritchie ...................... 106/287 |
| 3,920,865 A | 11/1975 | Läufer et al. ............... 427/220 |
| 4,705,725 A | 11/1987 | Glajch et al. ............... 428/405 |
| 4,771,328 A | 9/1988 | Malaviya et al. ............ 357/49 |
| 5,152,819 A | * 10/1992 | Blackwell et al. ........... 65/386 |
| 5,194,333 A | 3/1993 | Ohnaka et al. ............. 428/405 |
| 5,314,845 A | 5/1994 | Lee et al. .................... 437/238 |
| 5,364,800 A | 11/1994 | Joyner ......................... 437/28 |
| 5,376,595 A | 12/1994 | Zupancic et al. ............ 501/12 |
| 5,470,801 A | 11/1995 | Kapoor et al. .............. 437/238 |
| 5,558,718 A | 9/1996 | Leung .................... 118/723 E |
| 5,559,367 A | 9/1996 | Cohen et al. ................. 257/77 |
| 5,571,571 A | 11/1996 | Musaka et al. |
| 5,580,429 A | 12/1996 | Chan et al. ............ 204/192.38 |
| 5,628,871 A | 5/1997 | Shinagawa .................. 438/514 |
| 5,675,187 A | 10/1997 | Numata et al. ............. 257/758 |
| 5,688,724 A | 11/1997 | Yoon et al. ................. 437/235 |
| 5,858,879 A | 1/1999 | Chao et al. ................. 438/725 |
| 5,864,172 A | 1/1999 | Kapoor et al. .............. 257/634 |
| 5,874,367 A | 2/1999 | Dobson ...................... 438/787 |
| 5,874,745 A | 2/1999 | Kuo ............................ 257/59 |
| 5,878,649 A | * 3/1999 | Raab ......................... 92/12.2 |
| 5,882,489 A | 3/1999 | Bersin et al. .......... 204/192.35 |
| 5,904,154 A | 5/1999 | Chien et al. ................. 134/1.2 |
| 5,915,203 A | 6/1999 | Sengupta et al. ........... 438/669 |
| 5,930,655 A | 7/1999 | Cooney III |
| 5,939,763 A | 8/1999 | Hao et al. ................... 257/411 |
| 5,989,998 A | 11/1999 | Sugahara et al. |
| 6,020,458 A | * 2/2000 | Lee et al. .................... 528/401 |
| 6,025,263 A | 2/2000 | Tsai et al. ................... 438/624 |
| 6,028,015 A | 2/2000 | Wang et al. ................ 438/789 |
| 6,037,248 A | 3/2000 | Ahn ........................... 438/619 |
| 6,043,145 A | 3/2000 | Suzuki et al. |
| 6,043,167 A | 3/2000 | Lee et al. .................... 438/789 |
| 6,051,073 A | 4/2000 | Chu et al. ................... 118/723 |
| 6,051,477 A | 4/2000 | Nam .......................... 438/404 |
| 6,054,379 A | 4/2000 | Yau et al. |
| 6,063,702 A | 5/2000 | Chung |
| 6,066,574 A | 5/2000 | You et al. ................... 438/781 |
| 6,114,259 A | 9/2000 | Sukharev et al. ........... 438/789 |
| 6,147,012 A | 11/2000 | Sukharev et al. ........... 438/787 |
| 6,153,524 A | 11/2000 | Henley et al. .............. 438/691 |
| 6,204,192 B1 | 3/2001 | Zhao et al. ................. 438/723 |
| 6,207,585 B1 | 3/2001 | Hasegawa et al. |
| 6,215,087 B1 | 4/2001 | Akahori et al. |
| 6,232,658 B1 | 5/2001 | Catabay et al. ............. 257/701 |
| 6,303,047 B1 | 10/2001 | Aronowitz et al. |
| 6,316,354 B1 | 11/2001 | Hu |
| 6,365,528 B1 | 4/2002 | Sukharev et al. |
| 6,391,795 B1 | 5/2002 | Catabay et al. |
| 6,508,997 B2 * | 1/2003 | Choate et al. .............. 423/337 |
| 6,511,925 B1 | 1/2003 | Aronowitz et al. |

FOREIGN PATENT DOCUMENTS

| | | | | |
|---|---|---|---|---|
| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO99/41423 | 8/1999 | |

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced SiO$_2$ Planarization Using Silane and H$_2$O$_2$", *Semiconductor International*, Dec. 1994, pp. 85–88.

(List continued on next page.)

*Primary Examiner*—Stanley S. Silverman
*Assistant Examiner*—Edward M. Johnson
(74) *Attorney, Agent, or Firm*—John P. Taylor

(57) ABSTRACT

The invention provides a process for forming a low k fluorine and carbon-containing silicon oxide dielectric material by reacting with an oxidizing agent one or more silanes that include one or more organofluoro silanes selected from: (a) an organofluoro silane containing two silicon atoms linked by one oxygen atom; (b) an organofluoro silane containing two silicon atoms linked by one or more carbon atoms, where the one or more carbon atoms each are bonded to one or more fluorine atoms, or to one or more organofluoro moieties, or to a combination thereof; and (c) an organofluoro silane containing a silicon atom bonded to an oxygen atom. The invention also provides a process for forming a low k fluorine and carbon-containing silicon oxide dielectric material by reacting with an oxidizing agent one or more silanes that include one or more organofluoro silanes characterized by the presence of Si—O bonds.

34 Claims, 2 Drawing Sheets

OTHER PUBLICATIONS

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Nguyen, S. et al., "Reaction Mechanisms of Plasma– and Thermal–Assisted Chemical Vapor Deposition of Tetraethylorthosilicate Oxide Films", *J. Electrochem. Soc.*, vol. 137, No. 7, Jul., 1990, pp. 2209–2215.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746, no month.

Koda, Seiichiro, et al., "A Study of Inhibition Effects for Silane Combustion by Additive Gases", *Combustion and Flame*, vol. 73, No. 2, Aug., 1988, pp. 187–194.

* cited by examiner

```
┌─────────────────────────────────────────┐
│  PROVIDING A SEMICONDUCTOR SUBSTRATE IN │
│  A CVD REACTOR ON A SUBSTRATE SUPPORT   │
│  CAPABLE OF MAINTAINING THE SUBSTRATE   │
│  AT A TEMPERATURE NOT EXCEEDING ABOUT   │
│  25°C DURING FORMATION OF FLUORINE AND  │
│     CARBON-CONTAINING SILICON OXIDE     │
│            DIELECTRIC MATERIAL          │
└─────────────────────────────────────────┘
                     │
                     ▼
┌─────────────────────────────────────────┐
│     INTRODUCING INTO THE CVD REACTOR A  │
│        VAPOROUS SOURCE OF PEROXIDE AND A│
│     VAPOROUS ORGANOFLUORO SILANE HAVING │
│      TWO SILICON ATOMS LINKED BY EITHER │
│         AN OXYGEN ATOM OR A CARBON ATOM │
└─────────────────────────────────────────┘
                     │
                     ▼
┌─────────────────────────────────────────┐
│  DEPOSITING ON THE SUBSTRATE IN THE CVD │
│    REACTOR A LOW K FILM OF FLUORINE AND │
│       CARBON-CONTAINING SILICON OXIDE   │
│     DIELECTRIC MATERIAL CHARACTERIZED BY│
│        IMPROVED RESISTANCE TO OXIDATION │
└─────────────────────────────────────────┘
```

FIGURE 1

PROCESS FOR FORMING A LOW DIELECTRIC CONSTANT FLUORINE AND CARBON-CONTAINING SILICON OXIDE DIELECTRIC MATERIAL

CROSS REFERENCE TO RELATED APPLICATIONS

The subject matter of this application relates to the subject matter of U.S. Pat. No. 6,572,925, issued on Jun. 3, 2003, entitled "PROCESS FOR FORMING A LOW DIELECTRIC CONSTANT FLUORINE AND CARBON-CONTAINING SILICON OXIDE DIELECTRIC MATERIAL", assigned to the assignee of this application, and filed on the same date as this application.

The subject matter of this application relates to the subject matter of U.S. Pat. No. 6,649,219, issued Nov. 18, 2003, entitled "A PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION", assigned to the assignee of this application, and filed on the same date as this application.

The subject matter of this application relates to the subject matter of U.S. Pat. No. 6,365,528, issued Apr. 2, 2002, entitled "LOW TEMPERATURE PROCESS FOR FORMING A LOW DIELECTRIC CONSTANT FLUORINE AND CARBON-CONTAINING SILICON OXIDE DIELECTRIC MATERIAL CHARACTERIZED BY IMPROVED RESISTANCE TO OXIDATION AND GOOD GAP-FILLING CAPABILITIES", and assigned to the assignee of this application.

BACKGROUND OF THE INVENTION

1. Field of the Invention

This invention relates to integrated circuit structures. More particularly this invention relates to the formation of a low dielectric constant (k) fluorine and carbon-containing silicon oxide dielectric material for use in the formation of integrated circuit structures.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

Dobson et al., in an article entitled "Advanced $SiO_2$ Planarization Using Silane and $H_2O_2$", published in Semiconductor International, December 1994, at pages 85–88, describe the low temperature formation of $SiO_2$ by reaction of silane ($SiH_4$) with hydrogen peroxide ($H_2O_2$) to produce a silicon oxide which flows like a liquid and thus exhibits good gap fill characteristics. In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on February 16–17, 1998 at Santa Clara, Calif., at pages 311–318, also describes the formation of methyl-doped silicon oxide by the low-k Flowfill process of reacting methyl silane with H2O2 to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

While such carbon-doped silicon oxide dielectric materials do exhibit the desired low k (i.e., dielectric constants below about 3.0), resulting in reduced capacitance of the dielectric material, a major problem of such carbon-doped silicon oxide is a low resistance to oxidation during subsequent processing steps that results in a destruction of the incorporated hydrocarbons and a resulting increase in the overall dielectric constant of the dielectric material. The sensitivity to oxidation is thought to be due to the reactivity of the C—H bonds of the methyl group bonded to silicon. The unintended removal of the methyl group results in a more hydrophilic surface that may be responsible for a so-called "via poisoning" which is observed after via etch and photoresist strip with oxygen-containing plasma, and is related to suppression of the surface nucleation in subsequent via liner deposition steps.

More recently, Sugahara et al., in an article entitled "Chemical Vapor Deposition of $CF_3$-Incorporated Silica Films for Interlayer Dielectric Applications", published in the 1999 Joint International Meeting, Electrochemical Society Meeting Abstracts, volume 99-2, Abstract 746, 1999, described the reaction of trimethyl-fluoromethyl-silane ($CF_3Si(CH_3)_3$) with an ozone oxidizer at an elevated temperature. Sugahara et al. stated that the low reactivity of Si-alkyl bonds required the deposition to be carried at elevated temperatures (~350° C.). The dielectric material formed by the reaction demonstrated resistance to oxidation by oxygen plasma. However, the precursor compound used by Sugahara yielded only approximately 15% $CF_3$ content in the product dielectric layer. Further, it is known that dielectric films produced by high temperature ozone processes are characterized by poor gap-fill, while continuous shrinkage in feature size of integrated circuit structure demands an increased gap-fill capability.

It would, therefore, be desirable to provide a process for forming a low k silicon oxide dielectric material using precursor compounds that can provide greater control of the amount of organofluoro moieties incorporated into the dielectric material. It would also be desirable to provide, in at least one embodiment, a low k silicon oxide dielectric material which exhibits the gap-fill properties and film adherence properties of CVD-formed low k carbon doped silicon oxide dielectric materials such as discussed by the Dobson et al., Peters, and McClatchie et al. articles discussed above, while also maintaining a low formation temperature to conserve the thermal budget of the integrated circuit structure. This invention provides these characteristics and provides additional advantages as well.

SUMMARY OF THE INVENTION

The invention provides a process for forming a low k fluorine and carbon-containing silicon oxide dielectric material by reacting with an oxidizing agent one or more silanes that include one or more organofluoro silanes selected from: (a) an organofluoro silane containing two silicon atoms linked by one oxygen atom; (b) an organofluoro silane containing two silicon atoms linked by one or more carbon atoms, where the one or more carbon atoms each are bonded to one or more fluorine atoms, or to one or more organofluoro moieties, or to a combination thereof; and (c) an organofluoro silane containing a silicon atom bonded to an oxygen atom. In one embodiment, the process of the invention is carried out using one or more organofluoro silanes having the formula: $(C_xF_{2x+1})(R_1)(R_2)Si((L)Si(R_3)(R_4))_n(R_5)$ where x=1 to 5; n=1 to 5; each of the n L's is selected from O and $(C(R_6)_2)_m$; m=1 to 4; $R_1$ and $R_2$ are selected from the same or different leaving group and the same or different $(C_xF_{2x+1})$; each of the n $R_3$'s and n $R_4$'s is independently selected from the same or different leaving group and the same or different $(C_xF_{2x+1})$; $R_5$ is a leaving group; and each of the 2n*m or fewer $R_6$'s is independently selected from F and the same or different $(C_xF_{2x+1})$.

The invention also provides a process for forming a low k fluorine and carbon-containing silicon oxide dielectric material by reacting with an oxidizing agent one or more silanes that include one or more organofluoro silanes characterized by the presence of Si—O bonds. In one embodiment, the process of the invention is carried out using one or more organofluoro silanes having the formula: $(C_xF_{2x+1})(R_1)(R_2)SiO(Si(R_3)(R_4)(L))_nSi(R_5)(R_6)(R_7)$ where x=1 to 5; n=0 to 4; each of the n L's is selected from O and $(C(R_8)_2)_m$; m=1 to 4; $R_1$ and $R_2$ are selected from the same or different leaving group and the same or different $(C_xF_{2x+1})$; each of the n $R_3$'s and n $R_4$'s are independently selected from the same or different leaving group and the same or different $(C_xF_{2x+1})$; $R_5$ and $R_6$ are selected from the same or different leaving group and the same or different $(C_xF_{2x+1})$; $R_7$ is a leaving group; and each of the 2n*m or fewer $R_8$'s are independently selected from F and the same or different $(C_xF_{2x+1})$.

The invention further provides a low dielectric constant fluorine and carbon-doped silicon oxide dielectric material for use in an integrated circuit structure comprising silicon atoms bonded to oxygen atoms, silicon atoms bonded to carbon atoms, and carbon atoms bonded to fluorine atoms, where the dielectric material is characterized by the presence of at least one pair of silicon atoms linked by one or more carbon atoms.

BRIEF DESCRIPTION OF THE DRAWINGS

FIG. 1 is a flowsheet illustrating a process of the invention using as a precursor an organofluoro silane containing two silicon atoms linked by either an oxygen atom or one or more carbon atoms.

DETAILED DESCRIPTION OF THE INVENTION

Figure 2:
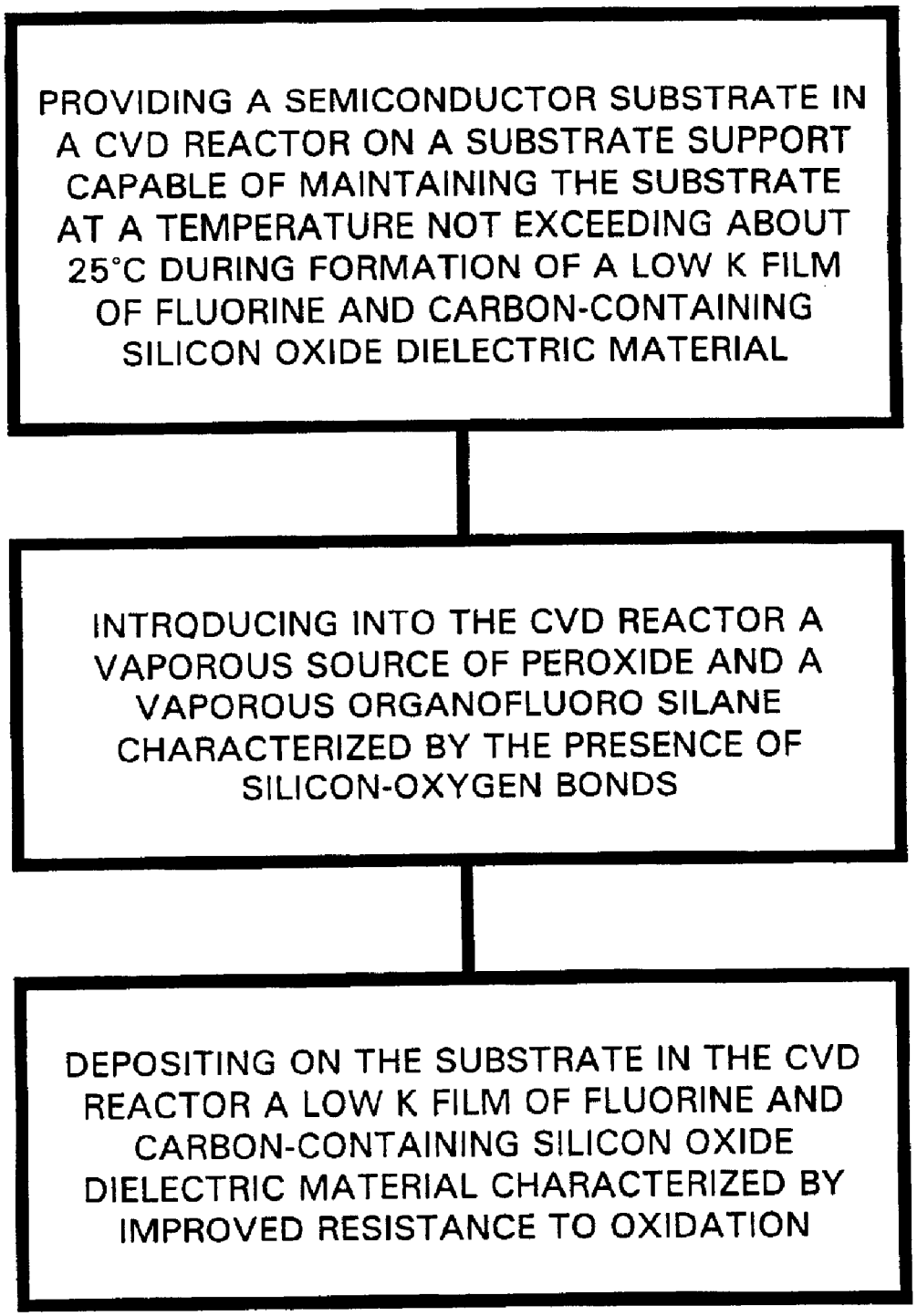
FIG. 2 is a flowsheet illustrating a process of the invention using as a precursor an organofluoro silane characterized by the presence of Si—O bonds.

The invention provides a process for forming a low k fluorine and carbon-containing silicon oxide dielectric material by reacting with an oxidizing agent one or more silanes containing one or more organofluoro silanes selected from: (a) an organofluoro silane containing two silicon atoms linked by one oxygen atom; (b) an organofluoro silane containing two silicon atoms linked by one or more carbon atoms, where the one or more carbon atoms each are bonded to one or more fluorine atoms, or to one or more organofluoro moieties, or to a combination thereof; and (c) an organofluoro silane containing a silicon atom bonded to an oxygen atom.

The low k fluorine and carbon-containing silicon oxide dielectric material formed in the method of the invention will have a resultant low dielectric constant relative to silicon oxide or silicon nitride dielectric materials, and will have an increased resistance to oxidation relative to traditional carbon-containing silicon oxide dielectric materials, which contain a large number of oxidant-sensitive aliphatic C—H bonds.

As used herein, an "organofluoro silane" is a compound that contains at least one silicon atom bonded to at least one carbon atom and at least one carbon atom bonded to at least one fluorine atom. Similarly, an "organofluoro moiety" is a moiety that contains at least one carbon atom bonded to at least one fluorine atom.

Use herein of the term "silanes" refers to silicon-containing compounds containing at least one silicon atom bonded to at least one hydrogen atom or bonded to at least one carbon atom. Exemplary silanes include $SiH_4$, $SiH_3(CH_3)$, and $SiH_3(CF_3)$.

By use of the interchangeable terms "low k" or "low dielectric constant" herein is meant a dielectric constant below the dielectric constant of silicon oxide or silicon nitride. Preferably, a low dielectric constant is a dielectric constant below about 3.5, and more preferably below about 3.

The term "aliphatic C—H bond" refers to a C—H bond where the carbon atom bonded to the hydrogen atom is not in an aromatic ring; thus, "aliphatic C—H bond", as used herein, includes alicyclic C—H bonds. Similarly, an "aliphatic hydrogen" is a hydrogen atom bound to a carbon through an aliphatic C—H bond.

The term "oxidizing agent" refers to an oxygen-containing compound capable of reacting with an organofluoro silane to form one or more Si—O bonds. Exemplary oxidizing agents include hydrogen peroxide, ozone $(O_3)$, oxygen $(O_2)$, oxides of nitrogen $(N_2O, NO, NO_2)$, and mixtures thereof. Typically an oxidizing agent used in the method of the invention will selectively react with C—F bonds less readily than aliphatic C—H bonds.

By use of the term "mild oxidizing agent" is meant an oxidizing agent, such as a peroxide, capable of oxidizing an organofluoro silane reactant at a low temperature, and which will not oxidize sufficiently vigorously to cause the Si—C bonds to break in preference to Si—H bonds, since cleavage of Si—C bonds can interfere with the film-forming capabilities of the reaction product. Typically, a mild oxidizing agent will cause cleavage of Si—H bonds in preference to Si—C bonds. An exemplary mild oxidation agent is hydrogen peroxide.

The term "strong oxidizing agent" means an oxidizing agent capable of forming Si—O bonds more readily than hydrogen peroxide. Exemplary strong oxidizing agents include ozone ($O_3$), oxygen ($O_2$), oxides of nitrogen ($N_2O$, NO, $NO_2$), and mixtures thereof.

The term "silicon-bonded moiety" as used herein refers to an atom or group of atoms, containing at least one atom bonded to a silicon atom.

By use of the term "low temperature" herein is meant a temperature not exceeding about 25° C., preferably not exceeding about 10° C., and most preferably not exceeding about 5° C. Typically, this temperature will be measured by reference to the temperature of the substrate support.

The term "link" and grammatic variants thereof, as used herein refers to an atom or moiety that is bonded to two adjacent atoms. For example, an oxygen atom that links two silicon atoms will be bonded to two silicon atoms as follows: Si—O—Si. Similarly, exemplary organofluoro moieties that link two silicon atoms will be bonded to two silicon atoms as follows: Si—$CF_2$—Si, Si—$CF_2$—$CF_2$—Si, and the like.

The term "leaving group" as used herein refers to a silicon-bonded moiety that undergoes oxidizing agent-mediated cleavage from a silicon atom more readily than a moiety having the formula $C_xF_{2x+1}$, where x=1 to 5. Preferably, a leaving group undergoes oxidizing agent-mediated cleavage from a silicon atom more readily than a $CF_3$ moiety. Exemplary leaving groups include H, organo moieties such as alkyl moieties, and oxyorgano moieties. As used herein, an "oxyorgano moiety" refers to a carbon and oxygen-containing moiety where an oxygen atom of the moiety is bonded to a silicon atom. Exemplary oxyorgano moieties include —$OCH_3$ and —$OCH_2CH_3$.

Organofluoro Silane

In one embodiment of the invention, the organofluoro silane contains two silicon atoms linked by either an oxygen atom or one or more carbon atoms. When the two silicon atoms are linked by one or more carbon atoms, the linking carbon atom(s) are also bonded to one or more fluorine atoms, or to one or more organofluoro moieties, or to a combination thereof. The number of carbon atoms linking two silicon atoms can range from 1 to 4 carbon atoms, preferably 1 to 3 carbon atoms, more preferably from 1 to 2 carbon atoms, and typically is 1 carbon atom. While such an organofluoro silane contains two silicon atoms, this compound can further contain additional silicon atoms. For example, an organofluoro silane can contain from 2 to 6 Si atoms, preferably from 2 to 4 Si atoms, more preferably from 2 to 3 Si atoms. Typically such an organofluoro silane will contain 2 Si atoms. It is within the scope of the invention that an organofluoro silane containing three or more silicon atoms can contain one or more oxygen atoms linking silicon atoms while also containing one or more carbon atoms linking silicon atoms. For example, an organofluoro silane can contain an oxygen atom linking a first set of two silicon atoms while also containing a carbon atom linking a second set of two silicon atoms, shown as: Si—O—Si—C—Si. Typically however, an organofluoro silane will contain only oxygen atoms linking silicon atoms or only carbon atoms linking silicon atoms. The use of a multiple-silicon atom-containing compound in the method of the invention will permit incorporation of a greater variety of organofluoro moieties, including incorporation of organofluoro moieties linking silicon atoms. Use of these organofluoro silanes will permit enhanced control of the number of carbon and fluorine atoms incorporated into the final low k silicon oxide dielectric material produced using the method of the invention.

As stated above, when one or more carbon atoms link two silicon atoms in an organofluoro silane used in the method of the invention, the carbon atoms will be bonded to one or more fluorine atoms or to one or more organofluoro moieties, or to a combination thereof. Typically, the one or more carbon atoms will be bonded to a moiety selected from F and $C_xF_{2x+1}$, where x=1 to 5. Preferably the one or more carbon atoms consist of a single carbon atom bonded to two fluorine atoms.

An organofluoro silane will contain at least one silicon atom bonded to an organofluoro moiety containing at least one carbon atom bonded to at least one fluorine atom. Typically, this carbon and fluorine-containing moiety will be a saturated fluorocarbon containing only carbon atoms and fluorine atoms and having the general formula $C_xF_{2x+1}$, where x ranges from 1 to 5; for example, —$CF_3$, —$CF_2CF_3$, —$CF(CF_3)_2$, —$CF_2CF_2CF_3$, —$CF_2CF_2CF_2CF_3$—$CF_2CF(CF_3)_2$, —$C(CF_3)_3$, and the like. While x can range from 1 to 5, x preferably ranges from 1 to 4, more preferably ranges from 1 to 3, most preferably ranges from 1 to 2, and typically is 1. For example, the moiety can be a single carbon atom linking 2 silicon atoms and the carbon atom can be bonded to two fluorine atoms.

The balance of the moieties bonded to each silicon atom are made up of: oxygen atoms bonded to either another silicon atom or a carbon atom (e.g., an oxyorgano moiety); organofluoro moieties containing at least one carbon atom bonded to at least one fluorine atom; leaving groups; or combinations of thereof.

Organofluoro silanes containing two or more silicon atoms (disilanes or polysilanes) useful in the process of the invention will typically have the formula: $(C_xF_{2x+1})(R_1)(R_2)Si((L)Si(R_3)(R_4))_n(R_5)$ where x=1 to 5; n=1 to 5; each of the n L's is selected from O and $(C(R_6)_2)_m$; m=1 to 4; $R_1$ and $R_2$ are selected from the same or different leaving group and the same or different $(C_xF_{2x+1})$; each of the n $R_3$'s and n $R_4$'s is independently selected from the same or different leaving group and the same or different $(C_xF_{2x+1})$; $R_5$ is a leaving group; and each of the 2n*m or fewer $R_6$'s is independently selected from F and the same or different $(C_xF_{2x+1})$. As used herein, "*" represents the mathematical multiplication function. For example, if n is 2 and m is 3, n*m is 2 multiplied by 3, which equals 6.

In one embodiment, each of the n $R_4$'s has the formula $C_xF_{2x+1}$. Exemplary organofluoro silanes useful in the method of the invention include $(CF_3)(CH_3)_2SiCF_2Si(CH_3)_2(CF_3)$;

$(CF_3)(CH_3)_2SiCF_2Si(CH_3)_2CF_2Si(CH_3)_2(CF_3)$;
$(CF_3)(CH_3)_2SiCF_2Si(CH_3)(CF_3)CF_2Si(CH_3)_2(CF_3)$;
$(CF_3)(CH_3)_2SiCF_2Si(CF_3)_2CF_2Si(CH_3)_2(CF_3)$;
$(CF_3)(CH_3)_2SiCF_2(Si(CH_3)_2CF_2)_2Si(CH_3)_2(CF_3)$;
$(CF_3)(CH_3)_2SiCF_2(Si(CH_3)(CF_3)CF_2)_2Si(CH_3)_2(CF_3)$;
$(CF_3)(CH_3)_2SiCF_2(Si(CF_3)_2CF_2)_2Si(CH_3)_2(CF_3)$;
$(CF_3)(CH_3)_2SiCF_2(Si(CH_3)_2CF_2)_3Si(CH_3)_2(CF_3)$;
$(CF_3)(CH_3)_2SiCF_2(Si(CH_3)(CF_3)CF_2)_3Si(CH_3)_2(CF_3)$;
$(CF_3)(CH_3)_2SiCF_2(Si(CF_3)_2CF_2)_3Si(CH_3)_2(CF_3)$;
$(CF_3)(CH_3)_2SiOSi(CH_3)(CF_3)CF_2Si(CF_3)_2CF_2Si(CH_3)(CF_3)CF_2Si(CH_3)_2(CF_3)$;
$(CF_3)(CH_3)_2SiOSi(CH_3)_2(CF_3)$; $(CF_3)(CH_3)_2SiOSi(CH_3)_2OSi(CH_3)_2(CF_3)$;

(CF$_3$)(CH$_3$)$_2$SiOSi(CH$_3$)(CF$_3$)OSi(CH$_3$)$_2$(CF$_3$); (CF$_3$)(CH$_3$)$_2$SiOSi(CF$_3$)$_2$(CF$_3$);

(CF$_3$)(CH$_3$)$_2$SiO(Si(CH$_3$)$_2$O)$_2$Si(CH$_3$)$_2$(CF$_3$); (CF$_3$)(CH$_3$)$_2$SiO(Si(CH$_3$)(CF$_3$)O)$_2$Si(CH$_3$)$_2$(CF$_3$);

(CF$_3$)(CH$_3$)$_2$SiO(Si(CF$_3$)$_2$O)$_2$Si(CH$_3$)$_2$(CF$_3$); (CF$_3$)(CH$_3$)$_2$SiO(Si(CH$_3$)$_2$O)$_3$Si(CH$_3$)$_2$(CF$_3$);

(CF$_3$)(CH$_3$)$_2$SiO(Si(CH$_3$)(CF$_3$)O)$_3$Si(CH$_3$)$_2$(CF$_3$); (CF$_3$)(CH$_3$)$_2$SiO(Si(CF$_3$)$_2$O)$_3$Si(CH$_3$)$_2$(CF$_3$);

(CF$_3$)(CH$_3$)$_2$SiOSi(CH$_3$)(CF$_3$)OSi(CF$_3$)$_2$OSi(CH$_3$)(CF$_3$)OSi(CH$_3$)$_2$(CF$_3$);(CF$_3$)H$_2$SiCF$_2$SiH$_2$(CF$_3$);

(CF$_3$)H$_2$SiCF$_2$SiH$_2$CF$_2$SiH$_2$(CF$_3$); (CF$_3$)H$_2$SiCF$_2$SiH(CF$_3$)CF$_2$SiH$_2$(CF$_3$);

(CF$_3$)H$_2$SiCF$_2$Si(CF$_3$)$_2$CF$_2$SiH$_2$(CF$_3$);(CF$_3$)H$_2$SiCF$_2$(SiH$_2$CF$_2$)$_2$SiH$_2$(CF$_3$);

(CF$_3$)H$_2$SiCF$_2$(SiH(CF$_3$)CF$_2$)$_2$SiH$_2$(CF$_3$); (CF$_3$)H$_2$SiCF$_2$(Si(CF$_3$)$_2$SiH$_2$(CF$_3$);

(CF$_3$)H$_2$SiCF$_2$(SiH$_2$CF$_2$)$_3$SiH$_2$(CF$_3$); (CF$_3$)H$_2$SiCF$_2$(SiH(CF$_3$)(CF$_2$)$_3$SiH$_2$(CF$_3$);

(CF$_3$)H$_2$SiCF$_2$(Si(CF$_3$)$_2$CF$_2$)$_3$SiH$_2$(CF$_3$);

(CF$_3$)H$_2$SiOSiH(CF$_3$)CF$_2$Si(CF$_3$)$_2$SiH(CF$_3$)CF$_2$SiH$_2$(CF$_3$); (CF$_3$)H$_2$SiO(SiH$_2$O)$_2$SiH$_2$(CF$_3$); (CF$_3$)H$_2$SiO(SiH(CF$_3$O)$_2$SiH$_2$(CF$_3$);

(CF$_3$)H$_2$SiO(Si(CF$_3$)$_2$O)$_2$SiH$_2$(CF$_3$); (CF$_3$)H$_2$SiO(SiH$_2$O)$_3$SiH$_2$(CF$_3$);

(CF$_3$)H$_2$SiO(SiH(CF$_3$)O)$_3$SiH$_2$(CF$_3$); (CF$_3$)H$_2$SiO(Si(CF$_3$)O)$_3$SiH$_2$(CF$_3$); and (CF$_3$)H$_2$SiOSiH(CF$_3$)OSi(CF$_3$)$_2$OSiH(CF$_3$)OSiH$_2$(CF$_3$).

Organofluoro silanes useful in the process of the invention can also be cyclo organofluoro silanes having the formula: (C$_x$F$_{2x+1}$)(R$_1$)(R$_2$)Si((L)Si(R$_3$)(R$_4$))$_n$, where x=1 to 5; n=2 to 5; each of the n L's is selected from O and (C(R$_5$)$_2$)$_m$; m=1 to 4; R$_1$ is selected from a leaving group and (C$_x$F$_{2x+1}$); R$_2$ is bonded to two silicon atoms and is selected from O and (C(R$_5$)$_2$)$_m$; each of the n R$_3$'s and n R$_4$'s is independently selected from a leaving group and (C$_x$F$_{2x+1}$); and each of the 2(n+1)*m or fewer R$_5$'s is independently selected from F and (C$_x$F$_{2+1}$). Preferably, a cyclo organofluoro silane contains 4 silicon atoms. One preferred family of cyclo organofluoro silanes is characterized by each of the n R$_3$'s being a leaving group; and each of the n R$_4$'s having the formula C$_x$F$_{2x+1}$.

An organofluoro silane, having a silicon-bonded organofluoro moiety, can also contain a hydrogen atom bonded to a silicon atom. In one embodiment, an organofluoro silane will contain only: one or more silicon atoms; one or more carbon atoms; one or more fluorine atoms; one or more hydrogen atoms, where the hydrogen atoms are bonded only to silicon atoms; and, optionally, one or more oxygen atoms bonded to silicon atoms.

Alternatively, an organofluoro moiety can contain one or more aromatic rings, so long as it also contains at least one carbon atom bonded to a fluorine atom. In one such case, the carbon atom bonded to the fluorine atom is an aliphatic carbon. For example, organofluoro moieties having one or more aromatic rings can include —Ph—CF$_3$, —CF$_2$—Ph, —CF$_2$—Ph—CF$_3$, and the like, where Ph is a six carbon aromatic ring. Since aromatic C—H bonds are more resistant to oxidation relative to aliphatic C—H bonds, the aromatic C—H bond will not be readily oxidized by the oxidizing agent used in the method of the invention. Similarly, an organofluoro silane may contain an aromatic moiety bound to silicon, which aromatic moiety does not contain fluorine atoms, so long as at least one other silicon-bonded moiety of the organofluoro silane contains at least one carbon atom bonded to at least one fluorine atom.

In one embodiment, it is desirable that some carbon atoms be incorporated into the backbone of the polymer product (the low k dielectric material) to enhance the thermal conductivity of the resultant dielectric film. Thus a silicon oxide containing carbon and fluorine atoms may have, for example, the structure:

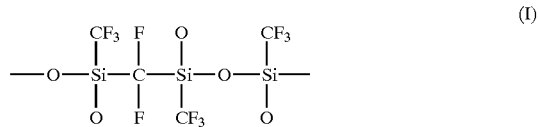

(I)

where one or more carbon atoms are incorporated into the silicon/oxygen chain. Such materials can be formed, for example, using organofluoro silanes having a —CF$_2$— linking two silicon atoms. For example, the organofluoro silane used to form the material of structure I can be H$_2$CF$_3$SiCF$_2$SiCF$_3$H$_2$.

In another embodiment of the invention, a process is provided for forming a low k fluorine and carbon-containing silicon oxide dielectric material by reacting with an oxidizing agent one or more silanes including one or more organofluoro silanes characterized by the presence of Si—O bonds. Organofluoro silanes containing Si—O bonds include compounds containing two silicon atoms linked by an oxygen atom. As discussed above, the presence of multiple silicon atoms in an organofluoro silane provides increased control of the carbon and fluorine moieties incorporated into the low k fluorine and carbon-containing silicon oxide dielectric material formed by the process of the invention.

An example of a family of multiple-silicon atom-containing organofluoro silanes containing two silicon atoms linked by an oxygen atom has the formula: (C$_x$F$_{2x+1}$)(R$_1$)(R$_2$)SiO(Si(R$_3$)(R$_4$)(L))$_n$Si(R$_5$)(R$_6$)(R$_7$) where x=1 to 5; n=0 to 4; each of the n L's is selected from O and (C(R$_8$)$_2$)$_m$; m=1 to 4; R$_1$, and R$_2$ are selected from the same or different leaving group and the same or different (C$_x$F$_{2x+1}$); each of the n R$_3$'s and n R$_4$'s are independently selected from the same or different leaving group and the same or different (C$_x$F$_{2x+1}$); R$_5$ and R$_6$ are selected from the same or different leaving group and the same or different (C$_x$F$_{2x+1}$); R$_7$ is a leaving group; and each of the 2n*m or fewer R$_8$'s are independently selected from F and the same or different (C$_x$F$_{2x+1}$). Exemplary organofluoro silane compounds characterized by the presence of Si—O bonds include:

(CF$_3$)(CH$_3$)$_2$SiOSi(CH$_3$)(CF$_3$)CF$_2$Si(CF$_3$)$_2$CF$_2$Si(CH$_3$)(CF$_3$)CF$_2$Si(CH$_3$)$_2$(CF$_3$);

(CF$_3$)(CH$_3$)$_2$SiOSi(CH$_3$)$_2$(CF$_3$); (CF$_3$)(CH$_3$)$_2$SiOSi(CH$_3$)$_2$OSi(CH$_3$)$_2$(CF$_3$);

(CF$_3$)(CH$_3$)$_2$SiOSi(CH$_3$)(CF$_3$)OSi(CH$_3$)$_2$(CF$_3$); (CF$_3$)(CH$_3$)$_2$SiOSi(CF$_3$)$_2$OSi(CH$_3$)$_2$(CF$_3$);

(CF$_3$)(CH$_3$)$_2$SiO(Si(CH$_3$)$_2$O)$_2$Si(CH$_3$)$_2$(CF$_3$); (CF$_3$)(CH$_3$)$_2$SiO(Si(CH$_3$)(CF$_3$)O)$_2$Si(CH$_3$)$_2$(CF$_3$);

(CF$_3$)(CH$_3$)$_2$SiO(Si(CF$_3$)$_2$O)$_2$Si(CH$_3$)$_2$(CF$_3$); (CF$_3$)(CH$_3$)$_2$SiO(Si(CH$_3$)$_2$O)$_3$Si(CH$_3$)$_2$(CF$_3$);

(CF$_3$)(CH$_3$)$_2$SiO(Si(CH$_3$)(CF$_3$)O)$_3$Si(CH$_3$)$_2$(CF$_3$); (CF$_3$)(CH$_3$)$_2$SiO(SiO(CF$_3$)$_2$O)$_3$Si(CH$_3$)$_2$(CF$_3$);

(CF$_3$)(CH$_3$)$_2$SiOSi(CH$_3$)(CF$_3$)OSi(CF$_3$)$_2$OSi(CH$_3$)(CF$_3$)OSi(CH$_3$)$_2$(CF$_3$);

(CF$_3$)H$_2$SiOSiH(CF$_3$)CF$_2$Si(CF$_3$)$_2$CF$_2$SiH(CF$_3$)CF$_2$SiH$_2$(CF$_3$);

(CF$_3$)H$_2$SiOSiH$_2$(CF$_3$); (CF$_3$)H$_2$SiOSiH$_2$OSiH$_2$(CF$_3$);

(CF$_3$)H$_2$SiOSiH(CF$_3$)OSiH$_2$(CF$_3$); (CF$_3$)H$_2$SiOSi(CF$_3$)$_2$OSiH$_2$(CF$_3$);

$(CF_3)H_2SiO(SiH_2O)_2SiH_2(CF_3)$; $(CF_3)H_2SiO(SiH(CF_3)O)_2SiH_2(CF_3)$;

$(CF_3)H_2SiO(Si(CF_3)_2O)_2SiH_2(CF_3)$; $(CF_3)H_2SiO(SiH_2O)_3SiH_2(CF_3)$;

$(CF_3)H_2SiO(SiH(CF_3)O)_3SiH_2(CF_3)$; $(CF_3)H_2SiO(Si(CF_3)_2O)_3SiH_2(CF_3)$; and $(CF_3)H_2SiOSiH(CF_3)OSi(CF_3)_2OSiH(CF_3)OSiH_2(CF_3)$.

An example of a family of cyclic organofluoro silanes has the formula: $((R_1)(R_2)SiO)_m$, where m=3 to 6; at least 1 of the m $R_1$'s is $C_xF_{2x+1}$, and the balance of the $R_1$'s are the same or different leaving group; the m $R_2$'s each are selected from $C_xF_{2x+1}$ and the same or different leaving group; and x=1 to 5. An example of a family of single silicon-containing organofluoro silane has the general formula for single-silicon atom-containing compounds: $(H)_ySi(C_xF_{2x+1})(OC_zH_{2z+1})_{3-y}$, where y is 0 to 2, x is 1 to 5, and z is 1 to 4. Exemplary organofluoro silane compounds characterized by the presence of Si—O bonds include $((CF_3)(CH_3)SiO)_4$; $((CF_3)(CH_3)SiO)_3(CF_3)_2SiO)$; $((CF_3)_2SiO(CH_3)_2SiO)_2$; $((CF_3)(CH_3)SiO)_6$, $H_2Si(CF_3)(OCH_3)$, $Si(CF_3)(OCH_3)_3$, $H_2Si(CF_3)(OCH_2CH_3)$, $Si(CF_3)(OCH_2CH_3)$, and the like.

Also within the scope of the invention is the use of organofluoro silanes containing a single silicon atom, where the silicon atom is bonded to at least one oxygen atom. Typically for such an organofluoro silane, the oxygen atom bonded to the silicon atom will also be bonded to an organo moiety, thereby forming an oxyorgano moiety. While not intending to be limited to the following theory, carrying out the process of the invention by reacting oxyorgano moieties bonded to silicon with a strong oxidizing agent at high temperature may result in simpler and more direct reaction pathways leading to the formation of the low k fluorine and carbon-containing silicon oxide dielectric material product relative to the more complex and indirect reaction pathways associated with use of organo moieties such as alkyl moieties.

In one embodiment of the invention, at least one silicon atom of the organofluoro silane is bonded to 1 to 3 oxyorgano moieties. Accordingly, reacting the organofluoro silane with an oxidizing agent causes cleavage of one of the two bonds in Si—O—C of the oxyorgano moiety, and formation of one Si—O—Si bond for each Si—O—C bond cleaved. The balance of the moieties bonded to each silicon atom are made up of: oxygen atoms, each bonded to another silicon atom; H or organo moieties; or fluorine and carbon-containing moieties containing carbon atoms bonded to fluorine atoms but not containing aliphatic carbon atoms bonded to hydrogen atoms; or any combination thereof. The oxyorgano moieties will contain at least one aliphatic C—H bond, thereby increasing or promoting the susceptibility of the oxyorgano moieties of the organofluoro silane to oxidation by the oxidizing agent when the organofluoro silane is reacted with the oxidizing agent. Typically, the organofluoro silane compounds of this embodiment will be further characterized as not having Si—H bonds. Since the Si—O—C bonds of oxyorgano moieties are more resistant to oxidation than Si—H bonds, a strong oxidizing agent, such as, for example, ozone, will typically be required to cleave off the alkoxy moieties and form Si—O—Si bonds. Similarly, organofluoro silanes containing organo moieties will typically require oxidation by a strong oxidizing agent such as ozone. Exemplary alkyl-fluoromethyl-silanes which may be used in the practice of this embodiment of the invention include $(CF_3)Si(OCH_3)_3$, $(CF_3)Si(OC_2H_5)_3$, $(CF_3)Si(CH_3)(OCH_3)_2$, $(CF_3)Si(C_2H_5)(OC_2H_5)_2$, $(CF_3)Si(CH_3)_2(OCH_3)$, and $(CF_3)Si(C_2H_5)_2(OC_2H_5)$.

Oxidizing Agent

The oxidizing agent used in the method of the invention can be any oxygen-containing compound capable of reacting with an organofluoro silane to form a Si—O bond. For particular reactions, the oxidizing agent will be capable of reacting with a Si—H bond in forming the Si—O bond. The oxidizing agent will selectively react with aliphatic C—H bonds more readily than with C—F bonds. Exemplary oxidizing agents capable of such a reaction include hydrogen peroxide, oxygen, ozone, and oxides of nitrogen ($N_2O$, NO, $NO_2$). Preferably, the oxidizing agent selectively cleaves Si—H bonds and aliphatic C—H bonds in preference over Si—O bonds, or C—F bonds. In one embodiment, the oxidizing agent also selectively cleaves Si—H bonds in preference over cleaving aromatic C—H bonds.

In another embodiment, an oxidizing agent for use in the method of the invention is a mild oxidizing agent, for example, hydrogen peroxide. A mild oxidizing agent reactant preferably comprises a vaporous source of peroxide. Such a peroxide can be conveniently obtained by flash evaporation of concentrated (30 vol. % or more) liquid hydrogen peroxide. By the term "source of peroxide" is meant any material capable of being heated (such as liquid hydrogen peroxide), or decomposed and heated (such as calcium peroxide or barium peroxide), to provide a vaporous hydrogen peroxide ($H_2O_2$) oxidizing agent. Hydrogen peroxide will typically be selected as an oxidizing agent when an organofluoro silane used in the method of the invention contains Si—H bonds.

In contrast, when the organofluoro silane does not contain Si—H bonds or contains aliphatic C—H bonds, it may be desirable to use an oxidizing agent which is more reactive than hydrogen peroxide, for example, oxygen or ozone. In such instances it may be further desirable to carry out the oxidation reaction using a plasma enhanced chemical vapor deposition (PECVD) method.

Reaction Conditions

The organofluoro silane and the oxidizing agent can be reacted together by introducing them into a reaction chamber and carrying out chemical vapor deposition. For example, an organofluoro silane and hydrogen peroxide are introduced into a reaction chamber containing a cooled substrate support therein on which is mounted a semiconductor substrate such as a silicon substrate on which the reaction product will deposit. For such a reaction, the reaction chamber is advantageously maintained at a pressure of from about 0.1 Torr to about 50 Torr, preferably from about 1 Torr to about 10 Torr, and most preferably from about 1 Torr to about 5 Torr. Both the organofluoro silane and the hydrogen peroxide are introduced into the chamber in a gaseous or vaporous phase. The delivery system for the reactants is preferably maintained at a temperature which ensures delivery of the reactants into the chamber as gases or vapors, typically from about 70° C. to about 100° C. Flow rates of the individual reactants will depend upon chamber size and will also vary with the particular reactants. During the reaction and deposition, the temperature of the substrate support in the reaction chamber is maintained at a low temperature not exceeding about 25° C., preferably not exceeding about 10° C., and most preferably not exceeding about 5° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more. Thicker layers can be formed, but are deemed unnecessary and merely add to the bulk of the structure. Such a reaction method forms a low k film having excellent via-filling properties, yields a dielectric layer with low adhesion stress, and can be preferable when using silane compounds that, under particular conditions, can be oxidized by mild oxidizing agents such as peroxide.

In another embodiment, the organofluoro silane and oxidizing agent reactants can be reacted together by introducing gaseous or vaporous organofluoro silane or an organofluoro silane-containing mixture and a strong oxidizing agent into a chamber at about 40 Torr to about 1000 Torr, preferably from about 700 Torr to about 800 Torr. The reaction can then be carried out at a temperature from about 250° C. to about 450° C., preferably from about 250° C. to about 400° C., and typically about 350° C. The strong oxidizing reagent used in the reaction can be any oxygen-containing oxidizing reagent capable of reacting with an organofluoro silane to form a low k fluorine and carbon-containing silicon oxide dielectric material, such as ozone ($O_3$), oxygen ($O_2$), oxides of nitrogen ($N_2O$, $NO$, $NO_2$), and the like. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more.

In yet another embodiment, a plasma-enhanced chemical vapor deposition (PECVD) can be carried out. A plasma-activated strong oxidizing agent and a gaseous or vaporous organofluoro silane or an organofluoro silane-containing mixture and a carrier gas such as helium can be introduced into a chamber at about 1 Torr to about 40 Torr, preferably from about 5 Torr to about 20 Torr. The reaction can then be carried out at a temperature from about 50° C. to about 450° C., preferably from about 200° C. to about 300° C., and typically about 250° C. The strong oxidizing reagent used in the reaction can be any oxygen-containing oxidizing reagent capable of reacting with an organofluoro silane to form a low k fluorine and carbon-containing silicon oxide dielectric material, such as ozone ($O_3$), oxygen ($O_2$), oxides of nitrogen ($N_2O$, $NO$, $NO_2$), and the like. Typically, the strong oxidizing agent will be oxygen. The reaction and deposition is carried out for a period of time sufficient to form the layer of low k fluorine and carbon-containing silicon oxide dielectric material to the desired thickness over the integrated circuit structure already formed on the silicon substrate. Usually this thickness will range from a minimum of about 300 nm to ensure sufficient electrical insulation between underlying conductive regions and conductive regions to be formed over the low k dielectric material up to a maximum of about 800 nm or more.

The choice of reaction protocol to be used in the method of the invention can be based on any of a variety of factors, for example: physical properties of the deposited film such as film stress; thermal budget of the integrated circuit structure; desired speed and efficiency of the oxidation reaction; and the like. The choice of reaction to be used can particularly be influenced by the nature of the organofluoro silane compound used in the method of the invention. For example, when an organofluoro silane has as leaving groups solely hydrogen atoms, the low temperature, mild oxidizing agent oxidation reaction will typically be preferred to a strong oxidizing agent oxidation reaction. However, when an organofluoro silane has as leaving groups solely organo or oxyorgano moieties, the low temperature, mild oxidizing agent oxidation reaction will not typically result in complete oxidation of the organofluoro silane; therefore, use of a strong oxidizing agent in a high temperature CVD or PECVD reaction will be preferable. For those organofluoro silanes having both hydrogen atoms and organo or oxyorgano moieties as leaving groups, the preferred oxidation method will be selected based on the quantity of a particular type of leaving group that is present in the organofluro silane relative to the quantity of silicon atoms present. For example, when there are present two or more organo or oxyorgano leaving groups, or a combination thereof, per silicon atom in an organofluoro silane, an oxidation reaction using a strong oxidizing agent will be preferred. In other instances, particularly when there are present two or more hydrogen atoms per silicon atom, the low temperature, mild oxidizing agent oxidation reaction will be preferred.

While not intending to be limited to the following theory, it is thought that, as the polymer forms, bonds of the organofluoro moieties to the silicon atoms of the silicon oxide polymer will not be oxidized as readily as bonds of unsubstituted alkyl moieties to the silicon atoms of the silicon oxide polymer. Furthermore, the dielectric constant of the resulting dielectric material having fluorocarbon groups substituted for alkyl groups should not be adversely affected by the higher polarizability of the fluorocarbon groups because of the higher volume of the fluorocarbon group over the alkyl group, since the dielectric constant is obtained by dividing the polarizability ($\alpha$) by the volume (v) in the formula k=$\alpha$/v and increases in polarizability tend to be canceled out by increases in volume.

Silane Mixtures

While the product of the process of the invention principally comprises a low dielectric constant (low k) silicon oxide dielectric material containing organofluoro groups, it is within the scope of the invention to utilize, in the process of the invention, mixtures of the organofluoro silanes with non-fluoro silanes, including $SiH_4$. Such materials can be blended with one or more of the above-described organofluoro silanes to enhance other physical properties of the resultant film of low k dielectric material. Exemplary physical properties include dielectric constant, adhesion capabilities, via filling capabilities, surface stress, and the like.

For example, to enhance the film forming properties of the low dielectric constant fluorine and carbon-containing silicon oxide dielectric material of the invention, one or more organofluoro silanes can be blended with one or more of the following non-fluoro silanes:

a) silanes having no silicon atoms bonded to carbon-containing groups;

b) organo silanes containing silicon atoms bonded to one or more carbon-containing groups having aliphatic C—H bonds (such as methyl silane used in the Trikon Flowfill process);

c) organo silanes that do not contain aliphatic C—H bonds, such as organo silanes containing a silicon atom bonded to an aromatic carbon group; and d) mixtures of any two or more of a), b), and c).

Such a mixture of silanes which includes one or more organofluoro silanes may be reacted, for example, with hydrogen peroxide ($H_2O_2$) in forming a low k fluorine and carbon-containing silicon oxide dielectric material. For example, a mixture of silanes corresponding to mixture a)

above could contain a mixture of silane ($SiH_4$) and an organofluoro silane having the formula $(C_xF_{2x+1})(R_1)(R_2)Si((L)Si(R_3)(R_4))_n(R_5)$ where x=1 to 5; n=1 to 5; each of the n L's is selected from O and $(C(R_6)_2)_m$; m=1 to 4; $R_1$ and $R_2$ are selected from the same or different leaving group and the same or different $(C_xF_{2x+1})$; each of the n $R_3$'s and n $R_4$'s is independently selected from the same or different leaving group and the same or different $(C_xF_{2x+1})$; $R_5$ is a leaving group; and each of the 2n or *mfewer $R_6$'s is independently selected from F and the same or different $(C_xF_{2x+1})$. A mixture of silanes corresponding to mixture b) could contain methyl silane combined with the organofluoro silane $(C_xF_{2x+1})(R_1)(R_2)Si((L)Si(R_3)(R_4))_n(R_5)$. To form a mixture including both a) and b), one could use both silane and methyl silane in combination with the organofluoro silane having the formula $(C_xF_{2x+1})(R_1)(R_2)Si((L)Si(R_3)(R_4))_n(R_5)$. Other examples of substituted silanes which can be used either singly or in combination to form mixtures of silanes containing organofluoro silanes include dimethyl silane, ethyl silane, isopropyl (1-methylethyl) silane, n-butyl silane, isobutyl (2-methyl propyl) silane, phenyl silane, and methylenebis-silane.

As stated above, the amount of such silanes which may be combined with one or more organofluoro silanes in the method of the invention will typically be combined as minor components. By use of the term "minor component" is meant that the one or more non-fluorosilanes used in a mixture of silanes will comprise less than 50 volume % of the total volume of the compounds in the mixture, ensuring that the major component of the mixture comprises one or more organofluoro silanes. However, it is recognized that in some instances the enhancement of other properties of the resulting mixture, e.g., the film forming properties, may justify the use of more that 50 volume % of other silanes, that is, up to about 70 volume % of other silanes and 30 volume % of one or more organofluoro silanes, even though such usage may raise the dielectric constant of the resulting dielectric material.

When using such mixtures the average dielectric constant of the dielectric material formed using a mixture of silanes can be determined for the particular proportions of such dielectric materials using the formula:

$$k_{av} = \Sigma_i x_i k_i$$

where $x_i$ is the volume fraction of dielectric component i and $k_i$ is the dielectric constant of the pure dielectric component. Thus, for example, dielectric materials (a) and (b) might be added to the low dielectric constant fluorine and carbon-containing silicon oxide dielectric material of the invention to enhance the film forming properties of the resulting mixture. If a mixture is formed comprising 10 volume % of dielectric material (a), 15 volume % of dielectric material (b), and 75 volume % of the low dielectric constant fluorine and carbon-containing silicon oxide dielectric material, the average dielectric constant of the mixture will comprise the sum of the products of the dielectric constant of each of the materials times its volume % in the mixture. If the dielectric constant of the low dielectric constant fluorine and carbon-containing silicon oxide dielectric material is 2.4, the dielectric constant of dielectric material (a) is 3.5, and the dielectric constant of dielectric material (b) is 3.4, the average dielectric constant $k_{av}$ would equal $(2.4 \times 0.75)+(3.5 \times 0.10)+(3.4 \times 0.15)=2.7$.

In Combination with Other Layers

While the low k fluorine and carbon-containing silicon oxide dielectric material formed in the method of the invention will have increased oxidation resistance relative to carbon-doped silicon oxide dielectric material, it may be desirable to form a thin conventional (standard k) silicon oxide ($SiO_2$) or silicon nitride base layer over the substrate to act as a moisture barrier layer for such low k fluorine and carbon-containing silicon oxide dielectric material subsequently formed thereon. A similar moisture barrier layer may also be formed over such a low k fluorine and carbon-containing silicon oxide dielectric layer for the same reasons. Such a barrier layer adjacent the layer of low k fluorine and carbon-containing silicon oxide dielectric material can be formed to a thickness of about 50 nanometers (nm) to provide adequate protection (if deemed necessary) for the low k fluorine and carbon-containing silicon oxide dielectric layer to be formed thereon. Thicknesses exceeding this minimum may be used, but are probably unnecessary and may negatively contribute to an undesired rise in the overall dielectric constant of the resulting composite layer. Such barrier layers may then serve to protect the low k dielectric material during subsequent processing steps.

In another embodiment, deposition of the low k fluorine and carbon-containing silicon oxide dielectric material does not result in 100% filling of the via, for example, when the deposition is carried out using a strong oxidizing agent. In this instance, a subsequent step with superior gap-filling properties, such as deposition using hydrogen peroxide, can be used to fill any void remaining after the deposition with the strong oxidizing reagent. The silane used in the hydrogen peroxide oxidation step can be $SiH_4$, or can be an organo silane, an organofluoro silane, or any other dielectric material useful for filling voids in vias.

Similarly, the low k fluorine and carbon-containing silicon oxide dielectric material formed in the method of the invention may find utility, for example, as one or more of the low k dielectric layers described in Serial No. 09/426,061 and U.S. Pat. Nos. 6,423,628; 6,232,658; 6,391,795; 6,492,731; 6,350,700; 6,423,630; and 6,537,923; all assigned to the assignee of this invention.

Product-Dielectric Material

The low dielectric constant fluorine and carbon-containing silicon oxide dielectric material produced by the method of the invention will be suitable for use in integrated circuit structures. This fluorine and carbon-containing silicon oxide dielectric material will contain silicon atoms bonded to oxygen atoms, silicon atoms bonded to carbon atoms, and carbon atoms bonded to fluorine atoms. In one embodiment of the invention, the low dielectric constant fluorine and carbon-doped silicon oxide dielectric material is characterized by the presence of at least one pair of silicon atoms linked by one or more carbon atoms. Preferably, at least 1% of the silicon atoms will be linked by one or more carbon atoms, and more preferably at least 10% of the silicon atoms will be linked by one or more carbon atoms. Typically, such carbon atoms will also be bonded to: (a) one or more fluorine atoms; (b) one or more organofluoro moieties; (c) or a combination thereof. As discussed above, in some instances preferred thermal properties can result when carbon atoms are incorporated into the backbone of the dielectric material formed in the process of the invention. Further, it is desirable to have a relatively large number of fluorine atoms in the dielectric material formed by the process of the invention. Such a dielectric material will typically be formed by the above-described process of the invention where the process includes reacting with an oxidizing agent an organofluoro silane containing two silicon atoms linked by one or more carbon atoms.

A fluorine and carbon-containing silicon oxide dielectric material produced by the method of the invention will have a dielectric constant below the dielectric constant of silicon oxide or silicon nitride. Preferably, the dielectric constant of the fluorine and carbon-containing silicon oxide dielectric material will be below about 3.5, more preferably below about 3.

In another embodiment, the fluorine and carbon-containing silicon oxide dielectric material will be characterized by the absence of aliphatic C—H bonds. The fluorine and carbon-containing silicon oxide dielectric material will demonstrate superior resistance to degradation in subsequent processing steps such as, for example, via etch and photoresist removal steps. While not wishing to be limited by a particular theory, it is considered that organofluoro compounds, particularly those that do not contain aliphatic C—H bonds will have an increased resistance to oxidation. This resistance will decrease the susceptibility of the fluorine and carbon-containing silicon oxide dielectric material to physical degradation which can occur in a variety of manners, such as thermal instability, solvent absorption, and the like. Thus, the oxidation-resistant fluorine and carbon-containing silicon oxide dielectric material will typically contain more Si atoms than aliphatic C—H bonds.

In one embodiment, the fluorine and carbon-containing silicon oxide dielectric material will contain as principal components only silicon atoms, carbon atoms, fluorine atoms, and oxygen atoms. Such a fluorine and carbon-containing silicon oxide dielectric material will not contain a significant number of hydrogen atoms, and, consequently, will not contain a significant number of bonds susceptible to oxidation during deposition or subsequent processing steps.

In another embodiment, the fluorine and carbon-containing silicon oxide dielectric material will have a ratio of carbon atoms to silicon atoms of C:Si greater than about 1:3. As described above, the introduction of carbon atoms into a dielectric material has been useful for lowering the dielectric constant of silicon oxide dielectric materials. By introducing a greater ratio of carbon atoms to silicon atoms, the dielectric constant can be lowered even further. A particular choice of C:Si ratio will depend not only upon the desired dielectric constant, but also upon other desired physical properties of the dielectric material. Thus, a desired C:Si ratio can be greater than about 2:3, greater than about 1:1 or greater than about 3:2.

Similarly, because several components can be combined in a silane mixture used to form the fluorine and carbon-containing silicon oxide dielectric material, some silicon atoms may be not be bonded to any carbon atoms, while some carbon atoms may be bonded solely to other carbon atoms and other fluorine atoms. For example, a silane mixture can contain $SiH_4$ and $H_2(CF_2CF_3)SiOSi(CF_2CF_3)H_2$; in this example, the ratio of C:Si will be a function of the ratio of $H_2(CF_2CF_3)SiOSi(CF_2CF_3)H_2:SiH_4$ in the silane mixture. Such a ratio will typically be greater than about 1:3, greater than about 2:3, greater than about 1:1, or greater than about 3:2. Regardless, such a dielectric material will be characterized by the presence of C—C bonds.

Thus, the invention provides a low temperature process for forming a low k fluorine and carbon-containing silicon oxide dielectric material exhibiting superior resistance to oxidation than conventional carbon-doped low k silicon oxide dielectric materials while also providing good gap-filling capabilities and low stress adhesion not always found in other fluorine and carbon-containing silicon oxide dielectric materials.

The following example serves to further illustrate the process of the invention.

EXAMPLE 1

The following example demonstrates the process of the invention in the formation of a low k fluorine and carbon-containing silicon oxide dielectric material at low temperature using the mild oxidizing agent, hydrogen peroxide.

Di-trifluoromethyl-disiloxane $(CF_3)H_2SiOSiH_2(CF_3)$ and hydrogen peroxide can be introduced into a reaction chamber containing a cooled substrate support therein on which is mounted a silicon substrate on which the reaction product will deposit. The reaction chamber is advantageously maintained at a pressure of about 1–5 Torr. Both the di-trifluoromethyl-disiloxane and the hydrogen peroxide are introduced into the chamber in a gaseous or vaporous phase. The delivery system for the reactants is maintained at about 100° C., which ensures delivery of the reactants into the chamber as gases or vapors. Flow rates of the individual reactants will depend upon chamber size and will also vary with the particular reactants. During the reaction and deposition, the temperature of the substrate support in the reaction chamber is maintained at a low temperature not exceeding about 0–10° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will be a minimum of about 300 nm to ensure sufficient electrical insulation between underlying conductive regions and conductive regions to be formed over the low k dielectric material. Such a reaction method forms a low k film having excellent via-filling properties, yields a dielectric layer with low adhesion stress.

EXAMPLE 2

The following example demonstrates the process of the invention in the formation of a low k fluorine and carbon-containing silicon oxide dielectric material using the strong oxidizing agent, ozone.

Di-trifluoromethyl-tetramethyl-disiloxane $(CF_3)(CH_3)_2SiOSi(CH_3)_2CF_3$ and ozone can be introduced into a reaction chamber containing a silicon substrate on which the reaction product will deposit. The reaction chamber is advantageously maintained at a pressure of about 760 Torr. Both the di-trifluoromethyl-tetramethyl-disiloxane and the ozone are introduced into the chamber in a gaseous or vaporous phase. Flow rates of the individual reactants will depend upon chamber size and will also vary with the particular reactants. During the reaction and deposition, the temperature of the substrate support in the reaction chamber is maintained at a temperature of about 350° C. The reaction and deposition is carried out for a period of time sufficient to form the layer of low k fluorine and carbon-containing silicon oxide dielectric material to the desired thickness over the integrated circuit structure already formed on the silicon substrate. Usually this thickness will be a minimum of about 300 nm to ensure sufficient electrical insulation between underlying conductive regions and conductive regions to be formed over the low k dielectric material.

While a specific embodiment of the process of the invention has been illustrated and described for carrying out the invention, modifications and changes of the apparatus, parameters, materials, etc. used in the process will become apparent to those skilled in the art, and it is intended to cover in the appended claims all such modifications and changes which come within the scope of the invention.

Having thus described the invention, what is claimed is:

1. A process for forming a low k fluorine and carbon-containing silicon oxide dielectric material comprising reacting with an oxidizing agent one or more silanes comprising one or more organofluoro silanes having the formula:

$(C_xF_{2x+1})(R_1)(R_2)Si((L)Si(R_3)(R_4))_n(R_5)$ where x=1 to 5; n=1 to 5; each of the n L's is selected from O and $(C(R_6)_2)_m$; m=1 to 4; $R_1$ and $R_2$ are selected from the same or different leaving group and the same or different $(C_xF_{2x+1})$; each of the n $R_3$'s and n $R_4$'s is independently selected from the same or different leaving group and the same or different $(C_xF_{2x+1})$; $R_5$ is a leaving group; and each of the 2n*m or fewer $R_6$'s is independently selected from F and the same or different $(C_xF_{2x+1})$.

2. The process of claim 1 wherein each of the n L's is $CF_2$.

3. The process of claim 1 wherein x =1 to 2.

4. The process of claim 1 wherein each of the n $R_4$'s is the same or different $(C_xF_{2x+1})$.

5. The process of claim 1 wherein n =1.

6. The process of claim 1 wherein said oxidizing agent is selected from the group consisting of ozone ($O_3$), oxygen ($O_2$), oxides of nitrogen ($N_2O$, NO, $NO_2$), and combinations thereof.

7. The process of claim 6 wherein said oxidizing agent is ozone ($O_3$).

8. The oxidizing agent of claim 1 wherein said oxidizing agent is hydrogen peroxide.

9. A process for forming a low k fluorine and carbon-containing silicon oxide dielectric material comprising reacting with an oxidizing agent one or more silanes comprising one or more organofluoro silanes selected from the group consisting of:

(a) an organofluoro silane containing two silicon atoms linked by one oxygen atom;

(b) an organofluoro silane containing two silicon atoms linked by one or more carbon atoms, wherein said one or more carbon atoms each are bonded to one or more fluorine atoms, or to one or more organofluoro moieties, or to a combination thereof; and (c) an organofluoro silane containing a silicon atom bonded to an oxygen atom; and wherein at least one of said one or more organofluoro silanes is a cyclo organofluoro silane having the formula: $(C_xF_{2x+1})(R_1)(R_2)Si((L)Si(R_3)(R_4))_n$ where x=1 to 5; n=2 to 5; each of the n L's is selected from O and $(C(R_5)_2)_m$; m=1 to 4; $R_1$ is selected from a leaving group and $(C_xF_{2x+1})$; $R_2$ is bonded to two silicon atoms and is selected from O and $(C(R_5)_2)_m$; each of the n $R_3$'s and n $R_4$'s is independently selected from a leaving group and $(C_xF_{2x+1})$; and each of the 2(n=1)*m or fewer $R_5$'s is independently selected from F and $(C_xF_{2x+1})$.

10. The process of claim 9 wherein n =3.

11. The process of claim 9 wherein $R_1$ and each of the n $R_3$'s is the same or different leaving group; and each of the n $R_4$'s is the same or different $C_xF_{2x+1}$.

12. A process for forming a low k fluorine and carbon-containing silicon oxide dielectric material comprising reacting with an oxidizing agent one or more silanes including one or more organofluoro silanes characterized by the presence of Si—O bonds; and wherein said one or more organofluoro silanes has the formula: $(C_xF_{2x+1})(R_1)(R_2)SiO(Si(R_3)(R_4)(L))_nSi(R_5)(R_6)(R_7)$ where x=1 to 5; n=0 to 4; each of the n L's is selected from O and $(C(R_8)_2)_m$; m=1 to 4; $R_1$ and $R_2$ are selected from the same or different leaving group and the same or different $(C_xF_{2x+1})$; each of the n $R_3$'s and n $R_4$'s are independently selected from the same or different leaving group and the same or different $(C_xF_{2x+1})$; $R_5$ and $R_6$ are selected from the same or different leaving group and the same or different $(C_xF_{2x+1})$; $R_7$ is a leaving group; and each of the 2n*m or fewer $R_8$'s are independently selected from F and the same or different $(C_xF_{2x+1})$.

13. The process of claim 12 wherein one or more of said organofluoro silanes are further characterized by the absence of Si—H bonds.

14. The process of claim 12 wherein said oxidizing agent is selected from the group consisting of ozone ($O_3$), oxygen ($O_2$), oxides of nitrogen ($N_2O$, NO, $NO_2$), and combinations thereof.

15. The process of claim 14 wherein said oxidizing agent is ozone ($O_3$).

16. The process of claim 12 wherein said oxidizing agent is hydrogen peroxide.

17. A process for forming a low k fluorine and carbon-containing silicon oxide dielectric material comprising reacting with an oxidizing agent one or more silanes including one or more organofluoro silanes characterized by the presence of Si—O bonds; and wherein at least one of said one or more organofluoro silanes is a cyclo organofluoro silane having the formula: $((R_1)(R_2)SiO)_m$, where m=3 to 6; at least 1 of the m $R_1$'s is $C_xF_{2x+1}$, and the balance of the $R_1$'s are the same or different leaving group; the m $R_2$'s each are selected from $C_xF_{2x+1}$ and the same or different leaving group; and x=1 to 5.

18. The process of claim 17 wherein said one or more cyclo organofluoro silanes is selected from the group consisting of $((CF_3)(CH_3)SiO)_4$; $((CF_3)(CH_3)SiO)_3(CF_3)_2SiO)$; $((CF_3)_2SiO(CH_3)_2SiO)_2$; and $((CF_3)(CH_3)SiO)_6$.

19. A process for forming a low k fluorine and carbon-containing silicon oxide dielectric material comprising reacting with an oxidizing agent one or more silanes including one or more organofluoro silanes characterized by the presence of Si—O bonds; and said wherein one or more of said organofluoro silanes has the formula: $(H)_ySi(C_xF_{2x+1})(OC_zH_{2z+1})_{3-y}$, where y is 0 to 2, x is 1 to 5, and z is 1 to 4.

20. The process of claim 19 wherein said one or more organofluoro silanes is selected from the group consisting of $(CF_3)Si(OCH_3)_3$ and $(CF_3)Si(OC_2H_5)_3$.

21. A process for forming a low k fluorine and carbon-containing silicon oxide dielectric material comprising reacting with an oxidizing agent one or more silanes comprising one or more organofluoro silanes having the formula: $(C_xF_{2x+1})(R_1)(R_2)Si((L)Si(R_3)(R_4))_n(R_5)$ where x=1 to 5; n=1 to 5; each of the n L's is selected from O and $(C(R_6)_2)_m$; m=1 to 4; $R_1$ and $R_2$ are selected from the same or different leaving group and the same or different $(C_xF_{2x+1})$; each of the n $R_3$'s and n $R_4$'s is independently selected from the same or different leaving group and the same or different $(C_xF_{2x+1})$; $R_5$ is a leaving group; and each of the 2n*m or fewer $R_6$'s is independently selected from F and the same or different $(C_xF_{2x+1})$.

22. The process of claim 21 wherein each of the n L's is $C(R_6)_2$.

23. The process of claim 22 wherein each of the n L's is $CF_2$.

24. The process of claim 21 wherein said one or more organofluoro silanes are characterized by the presence of Si—O bonds.

25. The process of claim 24 wherein at least one of the n L's is O.

26. The process of claim 25 wherein each of the n L's is O.

27. A process for forming a low k fluorine and carbon-containing silicon oxide dielectric material comprising reacting with an oxidizing agent one or more silanes comprising one or more organofluoro silanes having the formula: $(C_xF_{2x+1})(R_1)(R_2)SiO(Si(R_3)(R_4)(L))_nSi(R_5)(R_6)(R_7)$ where x=1 to 5; n=0 to 4; each of the n L's is selected from O and $(C(R_8)_2)_m$/m=1 to 4; $R_1$ and $R_2$ are selected from the same or different leaving group and the same or different $(C_xF_{2x+1})$; each of the n $R_3$'s and n $R_4$'s are independently selected from the same or different leaving group and the same or different ($C_xF_{2x+1}$); $R_5$ and $R_6$ are selected from the same or different leaving group and the same or different ($C_xF_{2x+1}$); $R_7$ is a leaving group; and each of the 2n*m or fewer $R_8$'s are independently selected from F and the same or different ($C_xF_{2x+1}$).

28. The process of claim 27 wherein each of the n L's is O.

29. A process for forming a low k fluorine and carbon-containing silicon oxide dielectric material comprising reacting with an oxidizing agent one or more silanes comprising one or more cyclo organofluoro silanes having the formula: $(C_xF_{2x+1})(R_1)(R_2)Si((L)Si(R_3)(R_4))_n$ where x=1 to 5; n=2 to 5; each of the n L's is selected from O and $(C(R_5)_2)_m$; m=1 to 4; $R_1$ is selected from a leaving group and $(C_xF_{2x+1})$; $R_2$ is bonded to two silicon atoms and is selected from O and $(C(R_5)_2)_m$; each of the n $R_3$'s and n $R_4$'s is independently selected from a leaving group and $(C_xF_{2x+1})$; and each of the 2(n+1)*m or fewer $R_5$'s is independently selected from F and $(C_xF_{2x+1})$.

30. A process for forming a low k fluorine and carbon-containing silicon oxide dielectric material comprising reacting together a peroxide oxidizing agent and one or more silanes capable of reacting with said peroxide to form a film of said low k fluorine and carbon-containing silicon oxide dielectric material, said silanes comprising one or more organofluoro silanes selected from the group consisting of:

(a) an organofluoro silane containing two silicon atoms linked by one oxygen atom;

(b) an organofluoro silane containing two silicon atoms linked by one or more carbon atoms, wherein said one or more carbon atoms each are bonded to one or more fluorine atoms, or to one or more organofluoro moieties, or to a combination thereof; and (c) an organofluoro silane containing a silicon atom bonded to an oxygen atom.

31. The process of claim 30 wherein said one or more organofluoro silanes have the formula: $(C_xF_{2x+1})(R_1)(R_2)Si((L)Si(R_3)(R_4))_n(R_5)$ where x=1 to 5; n=1 to 5; each of the n L's is selected from O and $(C(R_6)_2)_m$; m=1 to 4; $R_1$ and $R_2$ are selected from the same or different leaving group and the same or different ($C_xF_{2x+1}$); each of the n $R_3$'s and n $R_4$'s is independently selected from the same or different leaving group and the same or different ($C_xF_{2x+1}$); $R_5$ is a leaving group; and each of the 2n*m or fewer $R_6$'s is independently selected from F and the same or different ($C_xF_{2x+1}$).

32. A process for forming a low k fluorine and carbon-containing silicon oxide dielectric material comprising reacting with an oxidizing agent one or more silanes comprising one or more organofluoro silanes selected from the group consisting of:

$(CF_3)(CH_3)_2SiCF_2Si(CH_3)_2(CF_3)$;
$(CF_3)(CH_3)_2SiCF_2Si(CH_3)_2CF_2Si(CH_3)_2(CF_3)$; $(CF_3)(CH_3)_2SiCF_2Si(CH_3)(CF_3)CF_2Si(CH_3)_2(CF_3)$;
$(CF_3)(CH_3)_2SiCF_2Si(CF_3)_2CF_2Si(CH_3)_2(CF_3)$;
$(CF_3)(CH_3)_2SiCF_2(Si(CH_3)_2CF_2)_2Si(CH_3)_2(CF_3)$;
$(CF_3)(CH_3)_2SiCF_2(Si(CH_3)(CF_3)CF_2)_2Si(CH_3)_2(CF_3)$;
$(CF_3)(CH_3)_2SiCF_2(Si(CF_3)_2CF_2)_2Si(CH_3)_2(CF_3)$;
$(CF_3)(CH_3)_2SiCF_2(Si(CH_3)_2CF_2)_3Si(CH_3)_2(CF_3)$;
$(CF_3)(CH_3)_2SiCF_2(Si(CH_3)(CF_3)CF_2)_3Si(CH_3)_2(CF_3)$;
$(CF_3)(CH_3)_2SiCF_2(Si(CF_3)_2CF_2)_3Si(CH_3)_2(CF_3)$;
$(CF_3)(CH_3)_2SiOSi(CH_3)(CF_3)CF_2Si(CF_3)_2CF_2Si(CH_3)(CF_3) CF_2Si(CH_3)_2(CF_3)$;
$(CF_3)(CH_3)_2SiOSi(CH_3)_2(CF_3)$; $(CF_3)(CH_3)_2SiOSi(CH_3)_2OSi(CH_3)_2(CF_3)$;
$(CF_3)(CH_3)_2SiOSi(CH_3)(CF_3)OSi(CH_3)_2(CF_3)$; $(CF_3)(CH_3)_2SiOSi(CF_3)_2OSi(CH_3)_2(CF_3)$;
$(CF_3)(CH_3)_2SiO(Si(CH_3)_2O)_2Si(CH_3)_2(CF_3)$; $(CF_3)(CH_3)_2SiO(Si(CH_3)(CF_3)O)_2Si(CH_3)_2(CF_3)$;
$(CF_3)(CH_3)_2SiO(Si(CF_3)_2O)_2Si(CH_3)_2(CF_3)$; $(CF_3)(CH_3)_2SiO(Si(CF_3)_2O)_3Si(CH_3)_2(CF_3)$;
$(CF_3)(CH_3)_2SiO(Si(CH_3)(CF_3)O)_3Si(CH_3)_2(CF_3)$; $(CF_3)(CH_3)_2SiO(Si(CF_3)_2O)_3Si(CH_3)_2(CF_3)$;
$(CF_3)(CH_3)_2SiOSi(CH_3)(CF_3)OSi(CF_3)_2OSi(CH_3)(CF_3) OSi(CH_3)_2(CF_3)$; $(CF_3)$; $(CF_3)H_2SiCF_2SiH_2(CF_3)$;
$(CF_3)H_2SiCF_2SiH_2CF_2SiH_2(CF_3)$; $(CF_3)H_2SiCF_2SiH (CF_3)CF_2SiH_2(CF_3)$;
$(CF_3)H_2SiCF_2Si(CF_3)_2CF_2SiH_2(CF_3)$; $(CF_3)H_2SiCF_2(SiH_2CF_2)_2SiH_2(CF_3)$;
$(CF_3)H_2SiCF_2(SiH(CF_3)CF_2)_2SiH_2(CF_3)$; $(CF_3)H_2SiCF_2(Si(CF_3)_2CF_2)_2SiH_2(CF_3)$;
$(CF_3)H_2SiCF_2(SiH_2CF_2)_3SiH_2(CF_3)$; $(CF_3)H_2SiCF_2(SiH (CF_3)CF_2)_3SiH_2(CF_3)$;
$(CF_3)H_2SiCF_2(Si(CF_3)_2CF_2)_3SiH_2(CF_3)$;
$(CF_3)H_2SiOSiH(CF_3)CF_2Si(CF_3)_2CF_2SiH(CF_3)CF_2SiH_2 (CF_3)$;
$(CF_3)H_2SiOSiH_2(CF_3)$; $(CF_3)H_2SiOSiH_2OSiH_2(CF_3)$;
$(CF_3)H_2SiOSiH(CF_3)OSiH_2(CF_3)$; $(CF_3)H_2SiOSi(CF_3)_2 OSiH_2(CF_3)$;
$(CF_3)H_2SiO(SiH_2O)_2SiH_2(CF_3)$; $(CF_3)H_2SiO(SiH(CF_3) O)_2SiH_2(CF_3)$;
$(CF_3)H_2SiO(Si(CF_3)_2O)_2SiH_2(CF_3)$; $(CF_3)H_2SiO (SiH_2O)_3SiH_2(CF_3)$;
$(CF_3)H_2SiO(SiH(CF_3)O)_3SiH_2(CF_3)$; $(CF_3)H_2SiO(Si (CF_3)_2O)_3SiH_2(CF_3)$; and $(CF_3)H_2SiOSiH(CF_3)OSi (CF_3)_2OSiH(CF_3)OSiH_2(CF_3)$.

33. A process for forming a low k fluorine and carbon-containing silicon oxide dielectric material comprising reacting with an oxidizing agent one or more silanes including one or more organofluoro silanes characterized by the presence of Si—O bonds; and wherein said one or more organofluoro silanes is selected from the group consisting of $(CF_3)(CH_3)_2SiOSi(CH_3)(CF_3)CF_2Si(CF_3)_2CF_2Si(CH_3) (CF_3)CF_2Si(CH_3)_2(CF_3)$;
$(CF_3)(CH_3)_2SiOSi(CH_3)_2(CF_3)$; $(CF_3)(CH_3)_2SiOSi (CH_3)_2OSi(CH_3)_2(CF_3)$;
$(CF_3)(CH_3)_2SiOSi(CH_3)(CF_3)OSi(CH_3)_2(CF_3)$; $(CF_3)(CH_3)_2SiOSi(CF_3)_2OSi(CH_3(CF_3)$;
$(CF_3)(CH_3)_2SiO(Si(CH_3)_2O)_2Si(CH_3)_2(CF_3)$; $(CF_3)(CH_3)_2SiO(Si(CH_3)(CF_3)O)_2Si(CH_3)_2(CF_3)$;
$(CF_3)(CH_3)_2SiO(Si(CF_3)_2O)_2Si(CH_3)_2(CF_3)$; $(CF_3)(CH_3)_2SiO(Si(CH_3)_2O)_3Si(CH_3)_2(CF_3)$;
$(CF_3)(CH_3)_2SiO(Si(CH_3)(CF_3)O)_3Si(CH_3)_2(CF_3)$; $(CF_3)(CH_3)_2SiO(Si(CF_3)_2O_3Si(CH_3)_2(CF_3)$;
$(CF_3)(CH_3)_2SiOSi(CH_3)(CF_3)OSi(CF_3)_2OSi(CH_3)(CF_3) OSi(CH_3)_2(CF_3)$;
$(CF_3)H_2SiOSiH(CF_3)CF_2Si(CF_3)_2CF_2SiH(CF_3)CF_2SiH_2 (CF_3)$; $(CF_3)H_2SiOSiH_2(CF_3)$; $(CF_3)H_2SiOSiH_2OSiH_2 (CF_3)$;
$(CF_3)H_2SiOSiH(CF_3)OSiH_2(CF_3)$; $(CF_3)H_2SiOSi(CF_3)_2 OSiH_2(CF_3)$;
$(CF_3)H_2SiO(SiH_2O)_2SiH_2(CF_3)$; $(CF_3)H_2SiO(SiH(CF_3) O)_2SiH_2(CF_3)$;
$(CF_3)H_2SiO(Si(CF_3)_2O)_2SiH_2(CF_3)$; $(CF_3)H_2SiO (SiH_2O)_3SiH_2(CF_3)$;

$(CF_3)H_2SiO(SiH(CF_3)O)_3SiH_2(CF_3)$; $(CF_3)H_2SiO(Si(CF_3)_2O)_3SiH_2(CF_3)$; and $(CF_3)H_2SiOSiH(CF_3)OSi(CF_3)_2OSiH(CF_3)OSiH_2(CF_3)$.

34. A process for forming a low k fluorine and carbon-containing silicon oxide dielectric material comprising reacting with an oxidizing agent one or more silanes including one or more organofluoro silanes containing:

a) two silicon atoms linked by one or more carbon atoms;
b) said one or more carbon atoms each bonded to:
   i) one or more fluorine atoms, or
   ii) to one or more organofluoro moieties; or
   iii to a combination thereof.

* * * * *